(12) United States Patent
Nakaya et al.

(10) Patent No.: US 6,570,236 B2
(45) Date of Patent: May 27, 2003

(54) SEMICONDUCTOR DEVICE

(75) Inventors: Shuji Nakaya, Kobe (JP); Mitsuaki Hayashi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/056,024

(22) Filed: Jan. 28, 2002

(65) Prior Publication Data
US 2002/0171098 A1 Nov. 21, 2002

(30) Foreign Application Priority Data
May 16, 2001 (JP) ........................................ 2001-145767

(51) Int. Cl.[7] .............................................. H01L 29/76
(52) U.S. Cl. ........................................................ 257/390
(58) Field of Search ................................. 257/282, 296, 257/300, 390, 288, 211, 382, 381, 383, 384, 385, 758, 529, 530, 209, 210

(56) References Cited

U.S. PATENT DOCUMENTS

| | | | | |
|---|---|---|---|---|
| 4,397,887 A | * | 8/1983 | Aytac et al. | |
| 4,513,494 A | * | 4/1985 | Batra | |
| 5,925,917 A | | 7/1999 | Maari | |
| 5,959,877 A | | 9/1999 | Takahashi | |
| 6,147,893 A | | 11/2000 | Liu | |
| 6,243,284 B1 | | 6/2001 | Kumagai | |

* cited by examiner

Primary Examiner—Nathan J. Flynn
Assistant Examiner—Kevin Quinto
(74) Attorney, Agent, or Firm—Stevens, Davis, Miller & Mosher, LLP

(57) ABSTRACT

On a semiconductor substrate surface, a drain diffusion layer, which is in common to two transistors that make up a memory cell pair, is formed and source diffusion layers, for each of the transistors, respectively, are formed so as to sandwich the drain diffusion layer from both sides, a bit line is formed from a lower wiring layer and is connected to the drain diffusion layer, a source line is formed from the uppermost wiring layer, and the writing of information is performed by making a contact hole exist or non-existent immediately below the source line arranged from the uppermost wiring layer, in other words, by connection or non-connection of the source diffusion layer with the source line. By this arrangement, the TAT can be shortened and, since the capacitance of the bit line is not increased, high-speed operation with a short precharge time and discharge time for the bit line can be realized and the consumption power can be lessened.

8 Claims, 12 Drawing Sheets

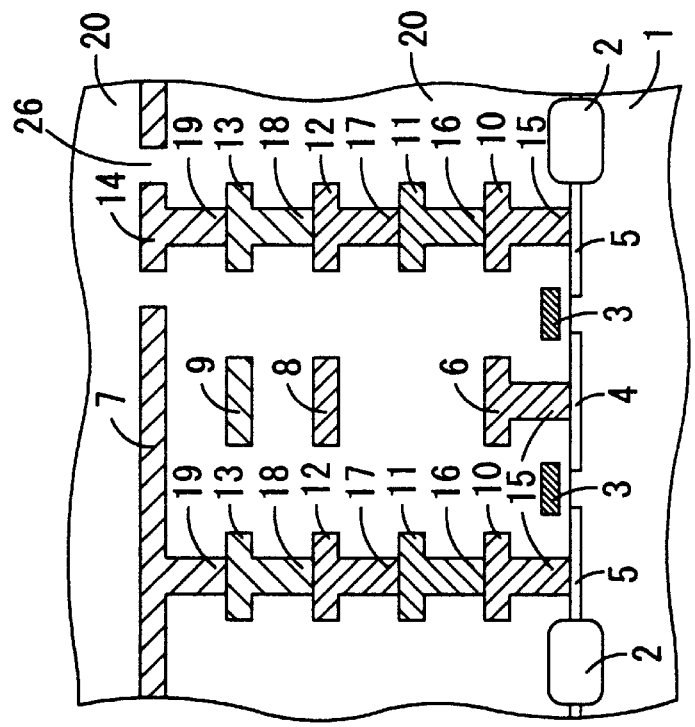
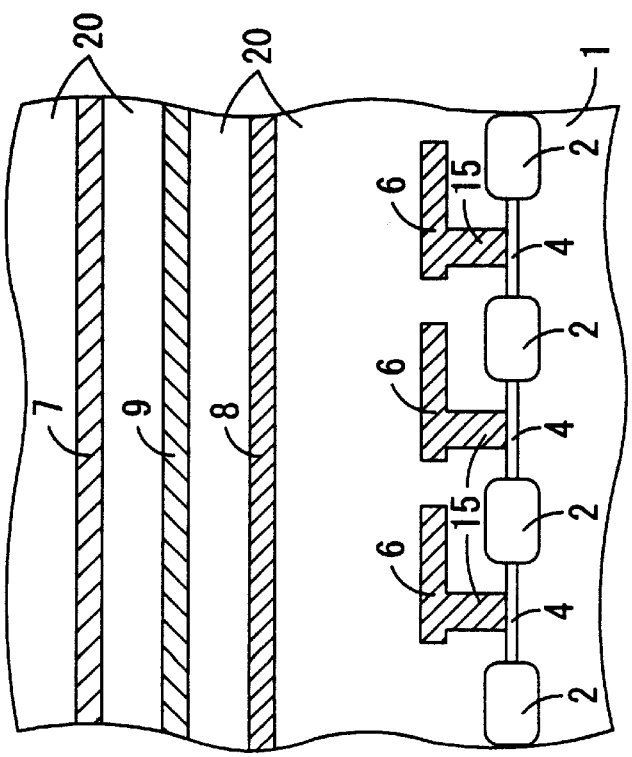
FIG. 4A
FIG. 4B

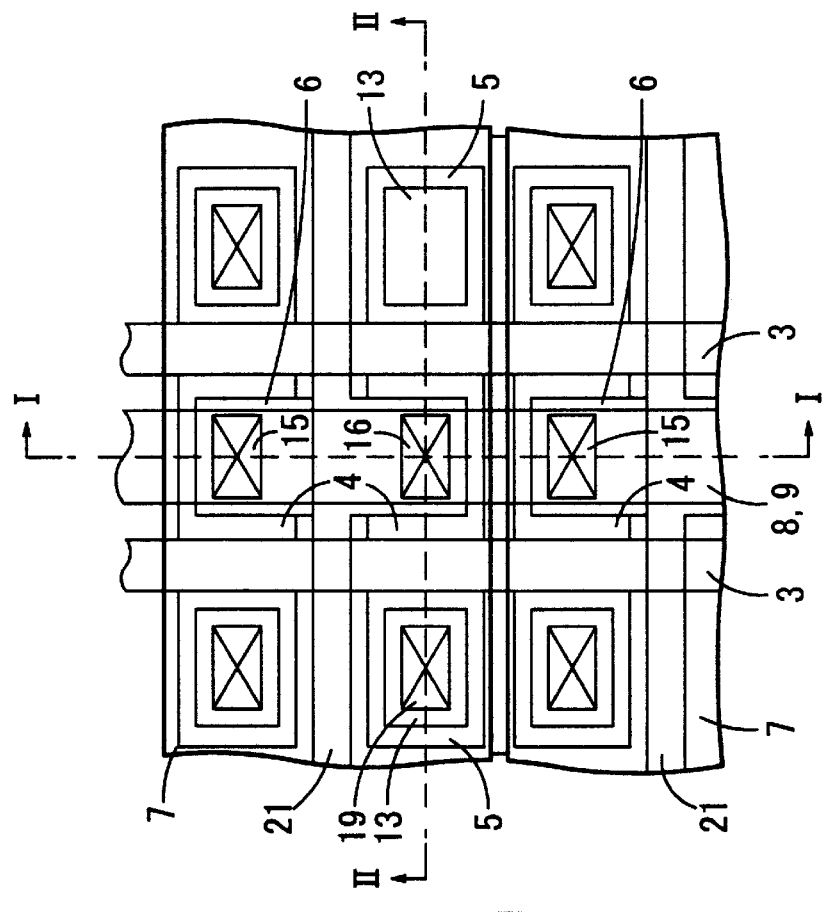
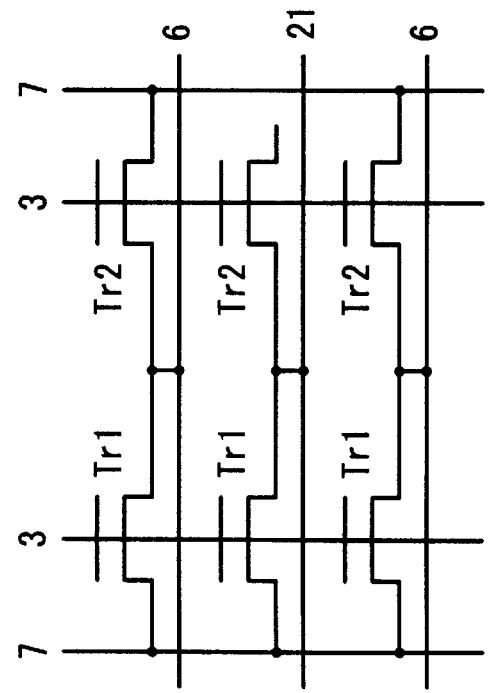

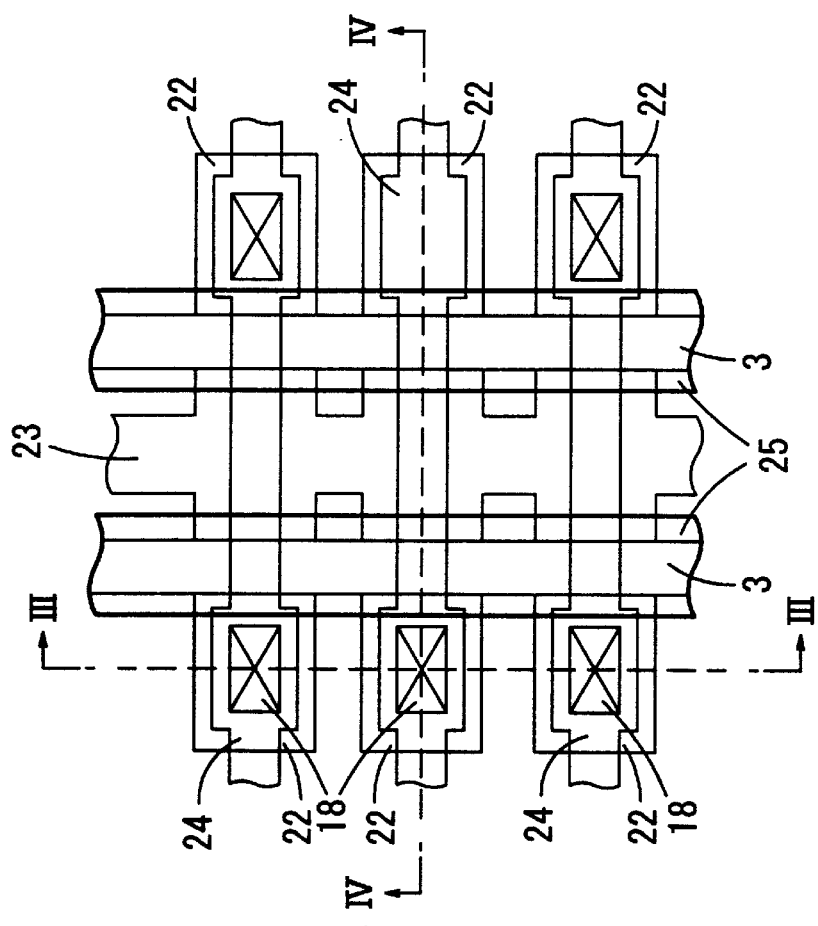
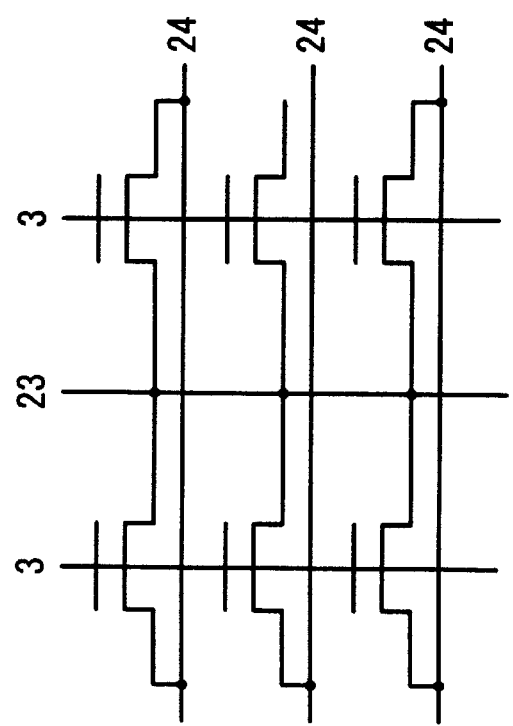

SEMICONDUCTOR DEVICE

BACKGROUND OF THE INVENTION

1. Field of the Invention

This invention concerns a semiconductor device, and in particular, concerns a mask ROM, into which information is written during the manufacturing process.

2. Prior Arts

With prior-art mask ROM's, the contact method, with which of the respective wiring layers of the source line, word line, and bit line that comprise a memory cell, the wiring layer of the bit line is formed last and the writing of information is performed by making a contact hole exist or non-existent between the bit line and each cell, has been known as a means of shortening the TAT (Turn Around Time), which is the period between the acquisition of ROM data from a customer to the shipment of a product or is the period, in the process of forming elements and wirings on a semiconductor substrate (shall be referred to hereinafter as "semiconductor treatment process"), from the process of writing the ROM data to the completion of the abovementioned semiconductor treatment process. This prior art shall now be described more specifically by the use of drawings.

FIG. 1A is a circuit diagram of a prior-art semiconductor device, FIG. 11B is a perspective view, which shows the planar layout of the same semiconductor device, FIG. 12A is a sectional view along line III—III of FIG. 11B, and FIG. 12B is a sectional view along line IV—IV of FIG. 11B. In FIGS. 11A, 11B, 12A, and 12B, 1 is a Si substrate, 2 is a field oxide film of SiO$_2$, which becomes an element separation region formed on substrate 1, 3 is a word line, 22 is a drain diffusion layer, 23 is a ground-potential source diffusion layer, 24 is a bit line of a fourth wiring layer, 25 is a wiring that is electrically connected to a word line of a fifth wiring layer and lowers the resistance of the word line (backing wiring of the word line), 10 is a first wiring layer, 11 is a second wiring layer, 12 is a third wiring layer, 15 is a contact hole, which connects drain diffusion layer 22 and first wiring layer 10, 16 is a contact hole, which connects first wiring layer 10 and second wiring layer 11, 17 is a contact hole, which connects second wiring layer 11 and third wiring layer 12, 18 is a contact hole, which connects third wiring layer 12 and bit line 24 of the fourth wiring layer, and 20 is an interlayer insulating film. Contact hole 18 is a contact hole for information writing, and information is written by making contact hole 18 exist or non-existent.

Since the fifth wiring layer, which is the uppermost layer, is provided with a backing wiring 25 for the word line, information-writing contact hole 18 is formed between fourth wiring layer 24 and third wiring layer 12. When an information-writing contact hole 18 exists, bit line 24 is connected to drain diffusion layer 22, via contact hole 18, third wiring layer 12, contact hole 17, second wiring layer 11, contact hole 16, first wiring layer 10, and contact hole 15, and when contact hole 18 does not exist, bit line 24 is not connected to drain diffusion layer 22.

The information reading operation is carried out as follows. First, prior to reading, bit line 24 is precharged to the "H" level (power supply voltage level) by a precharging circuit (not shown). The word line 3 that corresponds to the read address of the information is then set to the "H" level (power supply voltage level). At this point, if bit line 24 is connected to the drain diffusion layer 22 of the memory cell transistor, with which the gate electrode is coupled to the word line 3 of the "H" level, the transistor enters the ON state and bit line 24 is discharged to the "L" level (ground level). On the other hand, if there is no contact hole 18 and drain diffusion layer 22 and bit line 24 are not connected, since the transistor will then be cut off electrically from bit line 24, bit line 24 will be kept as it is at the "H" level. Information of 0 or 1 is then output upon judging whether the level of bit line 24 is "L" or "H" by means of a sense amp circuit (not shown) connected to bit line 24.

With the employment of multiple layer wiring in semiconductor devices in recent years, it is being demanded that information be written by making a contact hole exist or non-existent at an upper layer in a process close to the end of the abovementioned semiconductor treatment process in order to shorten the TAT.

With the above-described prior-art semiconductor device, the capacitance, which a bit line 24 is provided with, is comprised of the capacitance between this bit line 24 and an adjacent bit line 24, the capacitance between the contact holes 15, 16, 17, and 18 and wiring layers 10, 11, and 12, which connect bit line 24 to drain diffusion layer 22, and the adjacent contact holes 15, 16, 17, and 18 and wiring layers 10, 11, and 12, and the capacitance of drain diffusion layer 22. When an information-writing contact hole is thus located at an upper layer of a multilayer wiring structure, since the number of contact holes and wiring layers for connecting bit line 24 and drain diffusion layer 22 increases, the capacitance at the contact hole and wiring layer parts increases, causing the precharge time and discharge time of bit line 24 to increase and the power consumed by bit line 24 to increase.

Also, in order to make the area of the memory cell small, the backing wiring 25 of the word line is formed from the fifth layer, which is the uppermost layer, and bit line 24 is formed from the fourth wiring layer. Since contact hole 18 for writing information therefore could not be made a contact hole immediately below the uppermost wiring layer, the TAT could not be made short.

SUMMARY OF THE INVENTION

An object of this invention is to provide a semiconductor device, which, despite being of a multilayer wiring structure, is short in the TAT and with which the increase of the capacitance of the bit line is restrained to shorten the precharge time and discharge time of the bit line and enable lowering of the consumption power.

A semiconductor device of this invention is comprised of a drain diffusion layer, which is formed on a semiconductor substrate and is in common to first and second transistors that make up a memory cell pair, a source diffusion layer for the first transistor and a source diffusion layer for the second transistor, which are formed on the semiconductor substrate in a manner whereby they are spaced from the drain diffusion layer by predetermined intervals so as to sandwich the drain diffusion layer, a first word line, which is coupled to a gate electrode of the first transistor, a second word line, which is coupled to a gate electrode of the second transistor, a bit line, which is arranged from a first wiring layer above the semiconductor substrate and is connected to the drain diffusion layer, and a source line, which is arranged from a second wiring layer above the first wiring layer above the semiconductor substrate, and with this semiconductor device, the writing of information is performed by making a connection exist or non-existent between the respective source diffusion layers of the first and second transistors and the source line.

With the arrangement of this invention, the source line is arranged as an upper wiring layer, the bit line is arranged as a lower wiring layer, and the writing of information is performed, regardless of the connection relationship of the bit line, by connection/non-connection of the source diffusion layer and the source line. This connection/non-connection part can thus be made a contact hole at the uppermost wiring layer or below to shorten the TAT, and since the capacitance of the bit line is not increased, high-speed operation with a short bit line precharge time and discharge time can be realized and the consumption power can be lessened.

In this case, contact parts, which are arranged from a wiring layer that is one layer below the second wiring layer that comprises the source line and are connected respectively to the respective source diffusion layers of the first and second transistors, can be provided, and the connection of a source diffusion layer and the source line can be determined by the provision of a contact hole in an interlayer insulating film between the contact part and the source line and the non-connection of a source diffusion layer and the source line can be determined by the non-provision of such a contact hole.

Or, the respective source diffusion layers of the first and second transistors can be connected with the second wiring layer that comprises the source line via contact holes in an interlayer insulating film, and non-connection of a source diffusion layer and the source line can be determined by the provision of a space in the second wiring layer between the contact hole and the source line, and connection of a source diffusion layer and the source line can be determined by non-provision of such a space.

Also, with a semiconductor device of this invention, a first low-resistance wiring, which is formed, in parallel to the first word line, from a wiring layer between the first wiring layer and the second wiring layer, is electrically connected to the first word line, and is lower in resistance than the first word line, and a second low-resistance wiring, which is formed, in parallel to the second word line, from a wiring layer between the first wiring layer and the second wiring layer that differs from that of the first low-resistance wiring, is electrically connected to the second word line, and is lower in resistance than the second word line, can be provided as backing wirings for the word lines and the first low-resistance wiring and the second low-resistance wiring can be positioned so that they overlap at least in part above the first and second word lines.

With this arrangement, since the word line backing wirings (first and second low-resistance wirings) are formed by two wiring layers that are positioned so as to overlap at least partially, the writing of information using a wiring layer or the existence/non-existence of a contact hole at a layer above the word line backing wirings is enabled without increasing the area of the memory cell.

Also with a semiconductor device of this invention, a plurality of memory cell pairs can be disposed in the length direction of the first and second word lines, the first wiring layer that forms the bit line can be arranged as the two wiring layers of an upper wiring layer and a lower wiring layer, the plurality of memory cell pairs can be arranged so that a pair is formed by every two adjacently disposed memory cell pairs, the bit line of one of the memory cell pairs that form a pair can be formed from the lower wiring layer of the first wiring layer, and the bit line of the other memory cell pair can be formed from the upper wiring layer of the first wiring layer. With this arrangement, by forming adjacent bit lines from two wiring layers, adjacent bit lines can be disposed so as to overlap in part and the area of the memory cell can thus be made small.

BRIEF DESCRIPTION OF THE DRAWINGS

FIGS. 4A and 4B are sectional views of the semiconductor device of the second embodiment of this invention.

FIG. 5A is a circuit diagram of a semiconductor device of a third embodiment of this invention.

FIG. 5B is a perspective view of the planar layout of the semiconductor device of the third embodiment of this invention.

FIG. 11A is a circuit diagram of a prior-art semiconductor device.

FIG. 11B is a perspective view of the planar layout of the prior-art semiconductor device.

DESCRIPTION OF THE PREFERRED EMBODIMENTS (First Embodiment)

Figure 1A:
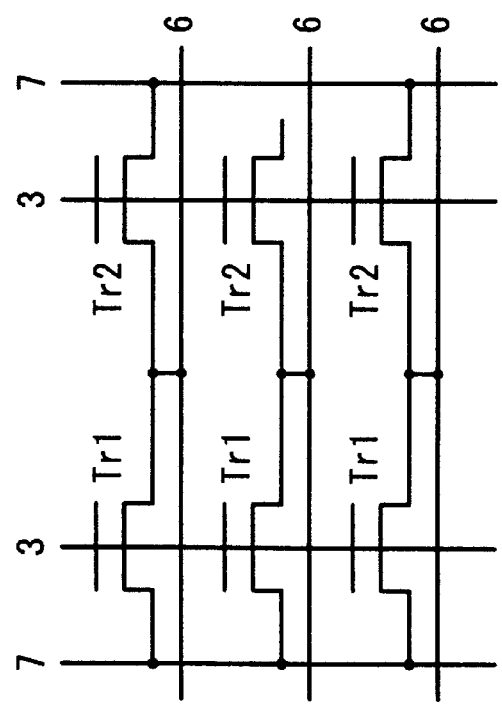
FIG. 1A is a circuit diagram of a semiconductor device of a first embodiment of this invention.
Figure 1B:
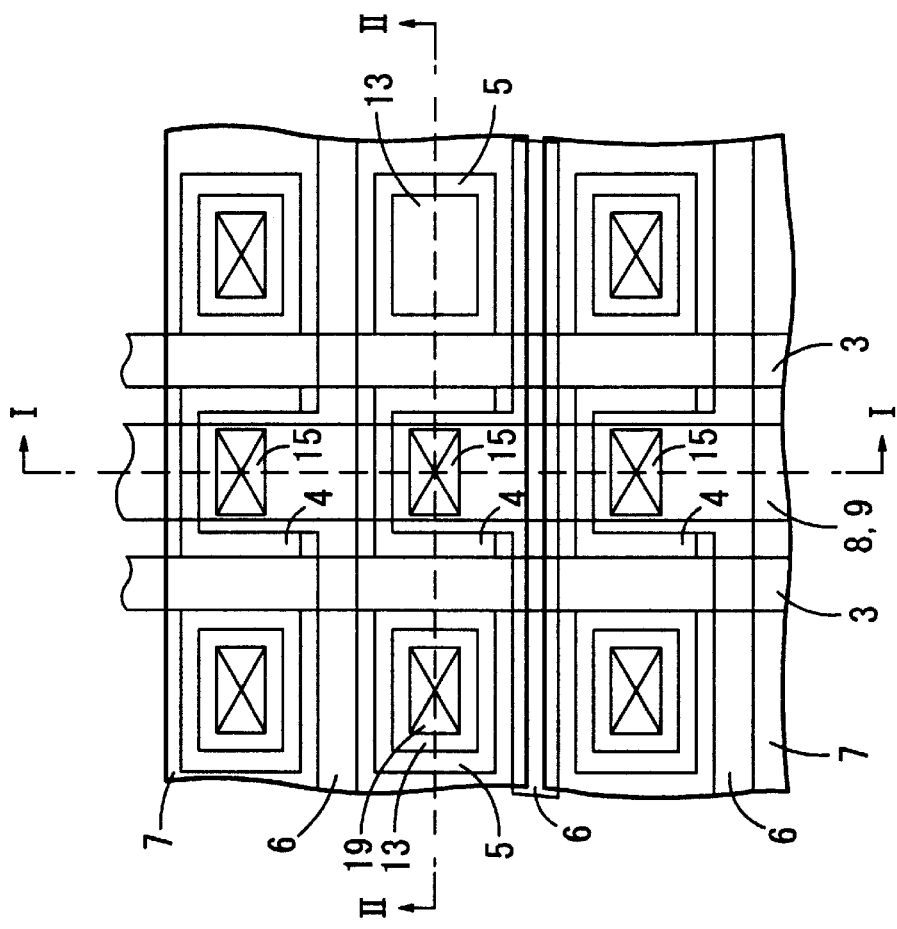
FIG. 1B is a perspective view of the planar layout of the semiconductor device of the first embodiment of this invention.
Figure 2A:
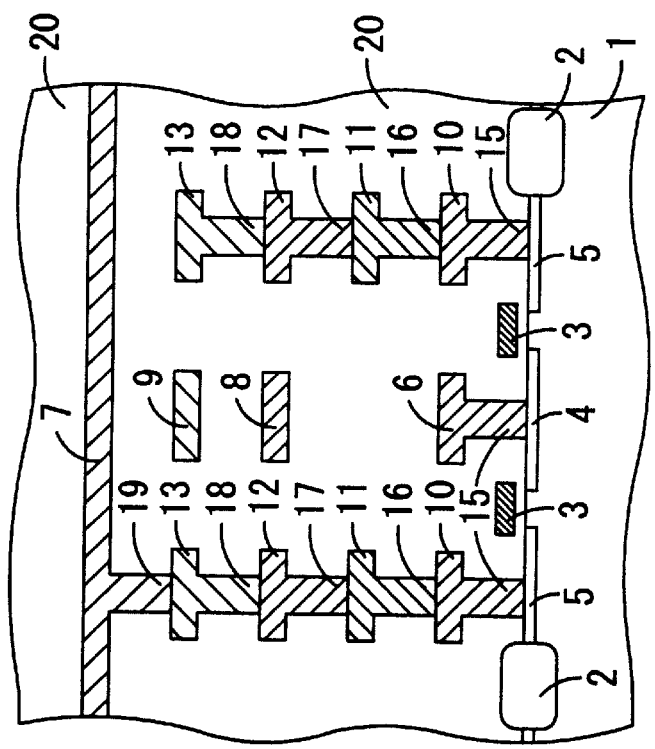
FIGS. 2A and 2B are sectional views of the semiconductor device of the first embodiment of this invention.
Figure 2B:
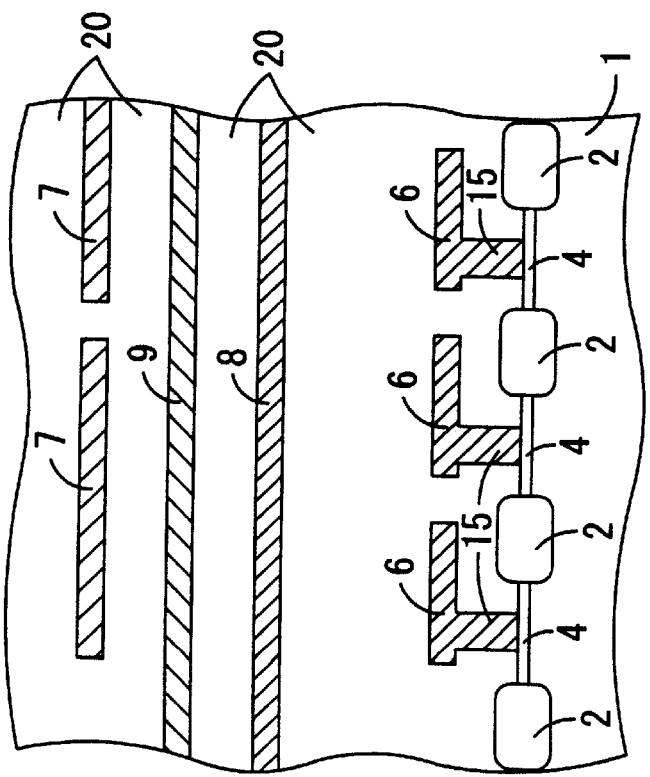

FIG. 1A is a circuit diagram of a semiconductor device of a first embodiment, FIG. 1B is a perspective view, which shows the planar layout of the same semiconductor device, FIG. 2A is a sectional view along line I—I of FIG. 1B, and FIG. 2B is a sectional view along line II—II of FIG. 1B. In FIGS. 1A, 1B, 2A, and 2B, the Si substrate 1, field oxide film 2, word line 3, first wiring layer 10, second wiring layer 11, third wiring layer 12, contact holes 15, 16, 17, and 18, and interlayer insulating film 20 are the same as those of the prior-art example. 4 is a drain diffusion layer, which is a diffusion layer in common for a memory cell pair, 5 is a source diffusion layer, which is a diffusion layer for an individual memory cell, 6 is a bit line, which is arranged from the first wiring layer, 7 is a source line, which is arranged from the fifth wiring layer that is the uppermost wiring layer, 8 is a word line backing wiring, which is arranged from the third wiring layer and is for making one of the word lines 3 of a memory cell pair low in resistance, 9 is a word line backing wiring, which is arranged from the fourth wiring layer and is for making the other word line 3 of the memory cell pair low in resistance, 13 is a fourth wiring layer, and 19 is a contact hole, which connects the fourth wiring layer 14 and the source line 7 of the fifth wiring layer.

With this semiconductor device, a plurality of memory cell pairs are equipped, a memory cell pair is comprised of two adjacently disposed transistors Tr1 and Tr2 that are memory cell transistors, these transistors Tr1 and Tr2 have in common a drain diffusion layer 4, which is formed to have an island form, and a source diffusion layer 5, of an island form, is formed for each individual transistor. In FIG. 1B, both drain diffusion layer 4 and source diffusion layer 5 are formed to have an island form of substantially the same square shape (drain diffusion layer 4 has a square shape even though part of its contours is illustrated as being hidden by bit line 6). Thus in FIG. 1B, the diffusion layers of transistor Tr1 and Tr2 of a memory cell pair are arranged with the common drain diffusion layer 4 being disposed between the source diffusion layer 5 of transistor Tr1 and the source diffusion layer 5 of transistor Tr2 with drain diffusion layer 4 being spaced from each of the source diffusion layers 5 by an interval, and the gate electrode between each of the source diffusion layers 5 and drain diffusion layer 4 is coupled to word line 3, which extends in the direction orthogonal to bit line 6. Also, the field oxide film 2 shown in FIGS. 2A and 2B is formed on the Si substrate surface so as to surround the peripheries of the two transistors Tr1 and Tr2 that comprise a memory cell pair (the surroundings of diffusion layers 5, 4, and 5).

Figure 9A:
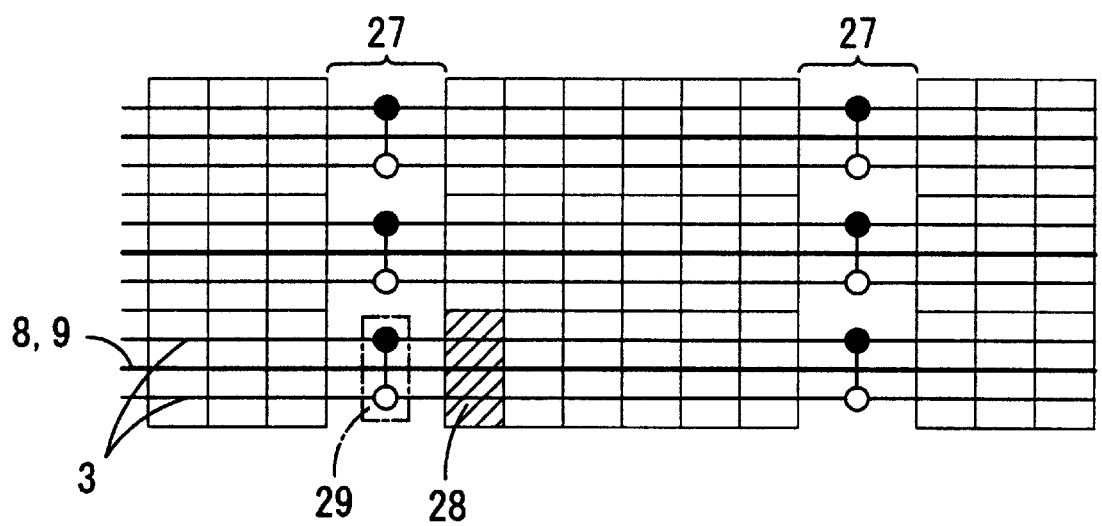
FIG. 9A is a plan view, which illustrates the method of connection of word line backing wirings with word lines in an embodiment of this invention.
Figure 9B:
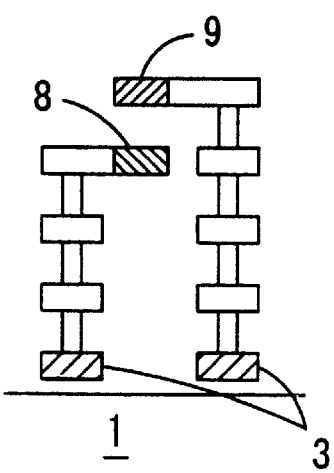
FIG. 9B is a sectional view of a part at which word line backing wirings and word lines are connected in FIG. 9A.

Also, the word line backing wirings 8 and 9 are lower in resistance than word line 3 and each is electrically connected to a different word line 3 among the two word lines 3 of a memory cell pair. As shown in FIG. 9A, at every n bit lines, a region 27 is provided at which the word line backing wirings 8 and 9 are connected to word lines 3 and a memory cell is not formed in this region 27. FIG. 9A is a plan view, which shows the layout of memory cells and the region 28, indicated as the slanted line part, is an example of a memory cell pair region. FIG. 9B is a schematic sectional view of a connection part 29 in a connection region 27 shown in FIG. 9A.

With the present embodiment, source line 7 has a width corresponding to two bit lines 6 and is disposed in parallel to bit line 6.

Though the writing of information is performed by making contact hole 19 exist or non-existent, bit line 6 is connected via contact hole 15 to drain diffusion layer 4 regardless of the existence/non-existence of contact hole 19. In the case where contact hole 19 exists, source line 7 is connected to source diffusion layer 5 via contact hole 19, fourth wiring layer 13, contact hole 18, third wiring layer 12, contact hole 17, second wiring layer 11, contact hole 16, first wiring layer 10, and contact hole 15, and when contact hole 19 is not present, source line 7 is not connected to source diffusion layer 5.

The information reading operation is performed as follows. First, prior to reading, bit line 6 is precharged to the "H" level (power supply voltage level) by a precharging circuit (not shown). Next, the word line 3, corresponding to the read address of the information, is set to the "H" level (power supply voltage level). If at this time, the source diffusion layer 5 of the memory cell transistor, with which the gate electrode is coupled to the world line 3 at the "H" level, is connected via contact hole 19 to source line 7, the transistor enters the ON state and bit line 6 becomes discharged to the "L" level (ground level) via the transistor and by source line 7. On the other hand, if contact hole 19 is not present, since source line 7 and source diffusion layer 5 are electrically cut off, bit line 6 is kept as it is at the "H" level. The information of 0 or 1 is then output upon judgment of the "L" or "H" level of bit line 6 by a sense amp circuit (not shown) that is connected to bit line 6.

Thus with the present embodiment, by forming, on the surface of Si substrate 1, a common drain diffusion layer 4 for two transistors Tr1 and Tr2 of a memory cell pair and individual source diffusion layers 5 for transistors Tr1 and Tr2, respectively, so as to sandwich the drain diffusion layer from both sides, forming a bit line 6 from a lower wiring layer and connecting it to drain diffusion layer 4, forming a source line 7 from the uppermost wiring layer, and performing the writing of information by making a contact hole 19 exist or non-existent immediately below the source line 7 of the uppermost wiring layer and regardless of the connection relationship of bit line 6, the TAT can be shortened and since the capacitance of bit line 6 is not increased, high-speed operation with a short precharge time and discharge time for bit line 6 can be realized and the consumption power can be lessened.

Also, by forming word line backing wirings 8 and 9 from two wiring layers below the uppermost layer and positioning these so that they overlap at least in part, the writing of information using the existence/non-existence of a contact hole 19 immediately below source line 7 of the uppermost wiring layer is enabled without increasing the area of the memory cell.

Also with the present embodiment, though source line 7 was made to have the width of a region corresponding to two bit lines 6 and was disposed in parallel to bit line 6, source line 7 may be made to have the width of a region corresponding to three or more bit lines 6 (the same applies to the third embodiment to be described below). By widening the width of source line 7, the resistance of source line 7 can be lowered.

Figure 10A:
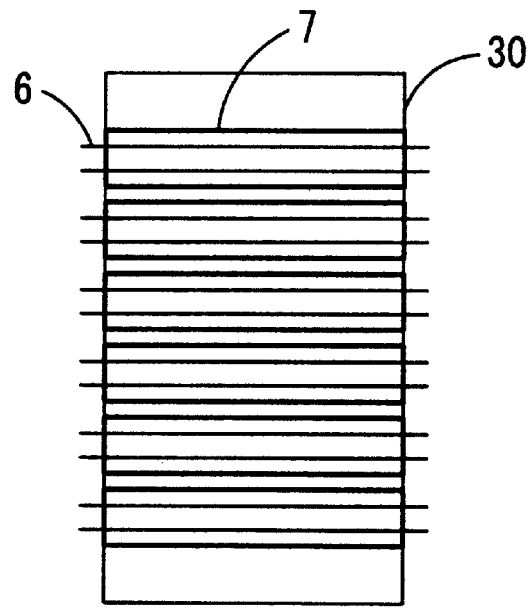
FIGS. 10A and 10B are plan views, which show a layout example of the source line of an embodiment of this invention.
Figure 10B:
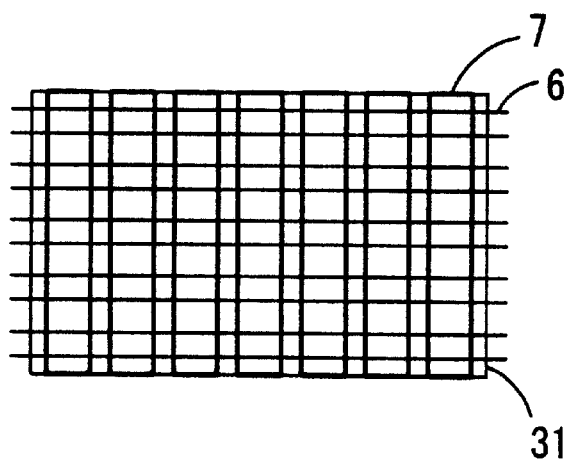
Figure 12A:
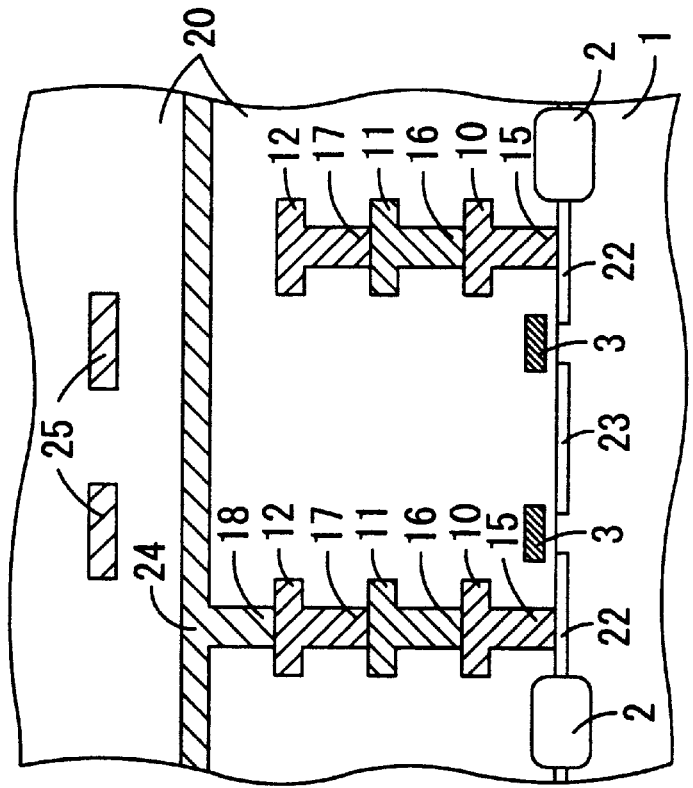
FIGS. 12A and 12B are sectional views of the prior-art semiconductor device.
Figure 12B:
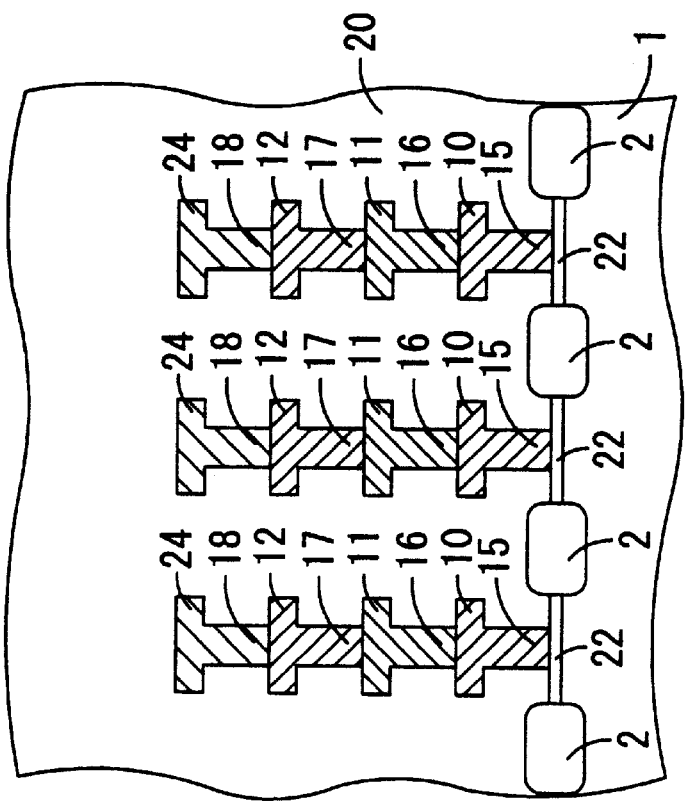

Also with the present embodiment, though source line 7 was disposed in parallel to bit line 6, it may be disposed perpendicular to bit line 6 (in parallel to word line 3) (the same applies to the third embodiment to be described below) When as shown in FIG. 10B, a memory cell array 31 becomes long in the length direction of bit line 6, since a GND (ground) wiring is provided in the surroundings of memory cell array 31, source line 7 is preferably disposed perpendicular to bit line 6 (in parallel to word line 3) in order to lower the resistance of source line 7. FIG. 10A shows the case of the present embodiment, and when a memory cell array 30 is long in the alignment direction of bit lines 6 as in this case, source line 7 is preferably disposed in parallel to bit line 6 in order to make it low in resistance.

Furthermore, though with the present embodiment, source line 7 was arranged in stripe-like manner as shown in FIGS. 10A and 10B based on the wiring width/wiring interval rules for manufacturing the semiconductor device as a product, theoretically, source line 7 may be disposed so as to cover the entirety of the memory cell (the same applies to the third embodiment to be described below).

(Second Embodiment)

Figure 3B:
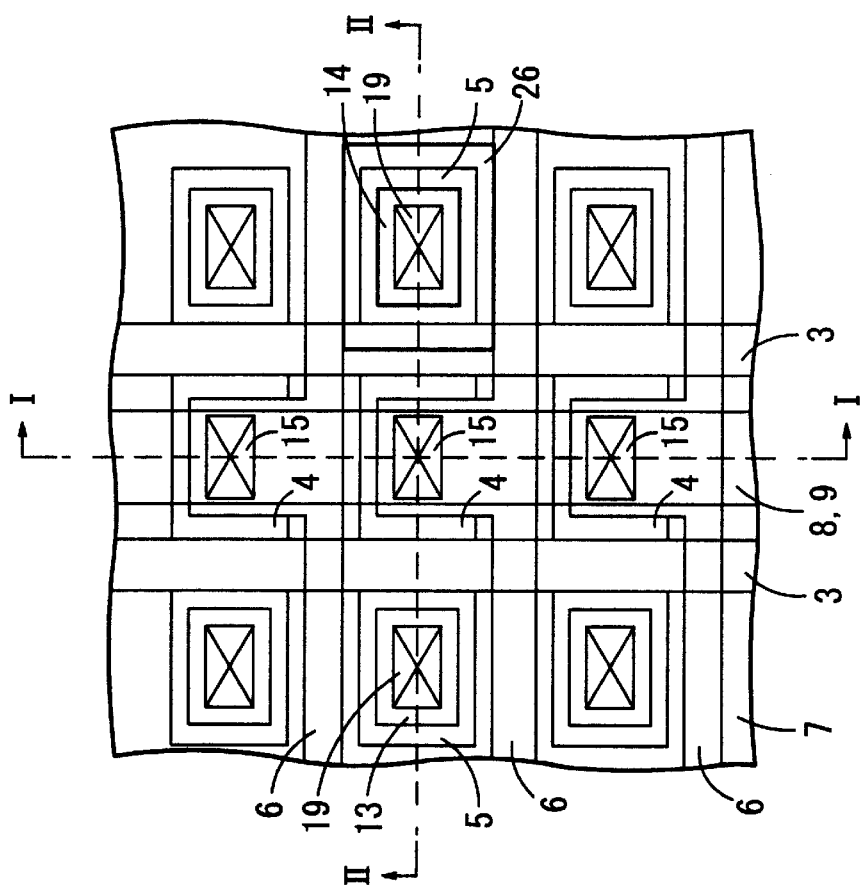
FIG. 3B is a perspective view of the planar layout of the semiconductor device of the second embodiment of this invention.
Figure 3A:
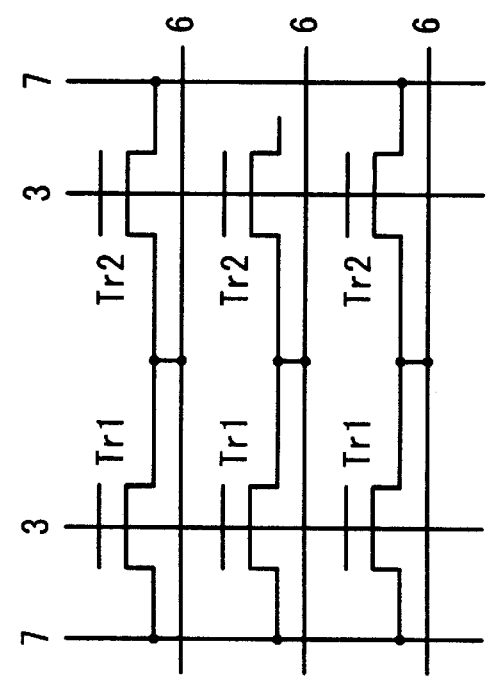
FIG. 3A is a circuit diagram of a semiconductor device of a second embodiment of this invention.

FIG. 3A is a circuit diagram of a semiconductor device of a second embodiment, FIG. 3B is a perspective view, which shows the planar layout of the same semiconductor device, FIG. 4A is a sectional view along line I—I of FIG. 3B, and FIG. 4B is a sectional view along line II—II of FIG. 3B. In FIGS. 3A, 3B, 4A, and 4B, the Si substrate 1, field oxide film 2, word line 3, drain diffusion layer 4, source diffusion layer 5, bit line 6, word line backing wirings 8 and 9, first wiring layer 10, second wiring layer 11, third wiring layer 12, fourth wiring layer 13, contact holes 15, 16, 17, 18, and 19, and interlayer insulating film 20 are the same as those of the first embodiment. 14 is a fifth wiring layer. Also with the present embodiment, source line 7 is formed so as to cover the entirety of the memory cell (with the exception of the hole 26 part).

The writing of information is performed by opening or not opening a hole 26 for separating the fifth wiring layer 14 above contact hole 19 from source line 7. The writing of information can thus be performed at the uppermost wiring layer. When a hole 26 is opened, source line 7 and source diffusion layer 5 will be cut off from each other electrically and when a hole 26 is not opened, source line 7 and source diffusion layer 5 will be connected electrically. The information reading operation is performed in the same manner as in the first embodiment.

Thus with the present embodiment, by forming, on the surface of Si substrate 1, a common drain diffusion layer 4 for two transistors Tr1 and Tr2 of a memory cell pairs and individual source diffusion layers 5 for transistors Tr1 and Tr2, respectively, so as to sandwich the drain diffusion layer from both sides, forming a bit line 6 from a lower wiring layer and connecting it to drain diffusion layer 4, forming source line 7 from the uppermost wiring layer, and performing the writing of information by making a hole 26 exist or non-existent at the uppermost wiring layer and regardless of the connection relationship of bit line 6, the TAT can be shortened, and since the capacitance of bit line 6 is not increased, high-speed operation with a short precharge time and discharge time for bit line 6 can be realized and the consumption power can be lessened.

Also, by forming word line backing wirings 8 and 9 from two wiring layers below the uppermost layer and positioning these so that they overlap at least in part, the writing of information using the uppermost wiring layer can be performed without making the area of the memory cell large.

Though in this embodiment source line 7 was formed so as to cover the entire memory cell, source line 7 may also be disposed in parallel (perpendicular to bit line 6) as shown in FIG. 10B (the same applies to the fourth embodiment to be described below).

(Third Embodiment)

Figure 6A:
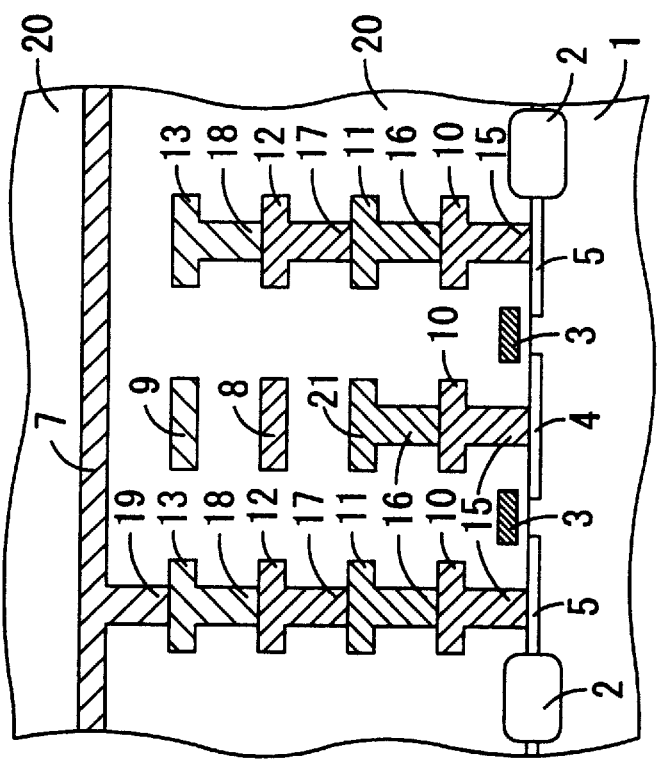
FIGS. 6A and 6B are sectional views of the semiconductor device of the third embodiment of this invention.
Figure 6B:
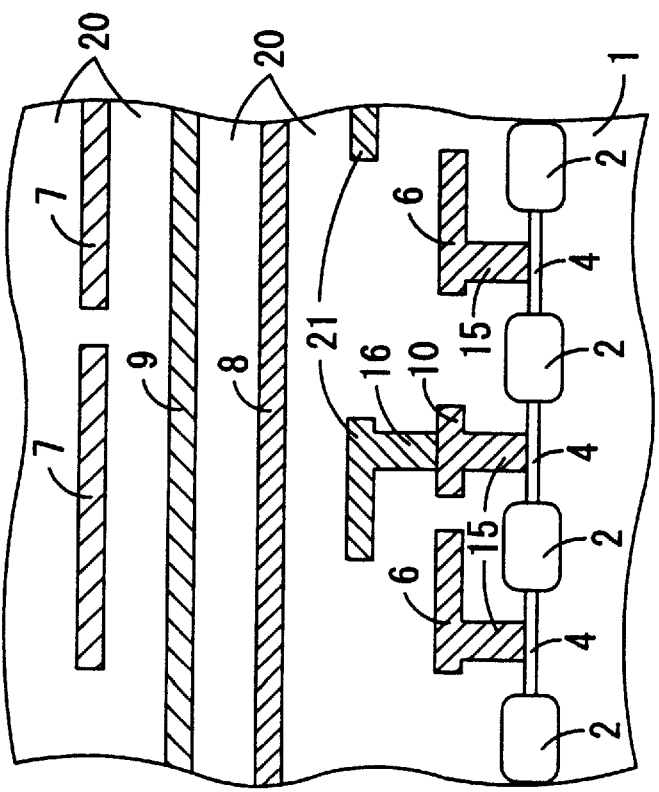

FIG. 5A is a circuit diagram of a semiconductor device of a third embodiment, FIG. 5B is a perspective view, which shows the planar layout of the same semiconductor device, FIG. 6A is a sectional view along line I—I of FIG. 5B, and FIG. 6B is a sectional view along line II—II of FIG. 5B. In FIGS. 5A, 5B, 6A, and 6B, the Si substrate 1, field oxide film 2, word line 3, drain diffusion layer 4, source diffusion layer 5, bit line 6, source line 7, word line backing wirings 8 and 9, first wiring layer 10, second wiring layer 11, third wiring layer 12, fourth wiring layer 13, contact holes 15, 16, 17, 18, and 19, and interlayer insulating film 20 are the same as those of the first embodiment. 21 is a bit line arranged from the second wiring layer. The information writing method and information reading operation are the same as those of the first embodiment.

The present embodiment is characterized in that a pair is arranged from every two memory cell pairs that are disposed adjacent each other in the length direction of word line 3, the bit line 6 of one memory cell pair among the memory cell pairs that form a pair is formed from the first wiring layer, the bit line 21 of the other memory cell pair is formed from the second wiring layer, and bit line 6 and bit line 21 are positioned so that they overlap with each other in part. The arrangements of the other parts are the same as those of the first embodiment.

With the present embodiment, the same effects as those of the first embodiment can be obtained, and furthermore, the area of the memory cell can be reduced by making bit line 6 of the first wiring layer and bit line 21 of the second wiring layer adjacent bit lines and positioning these so that they overlap with each other in part.

(Fourth Embodiment)

Figure 7B:
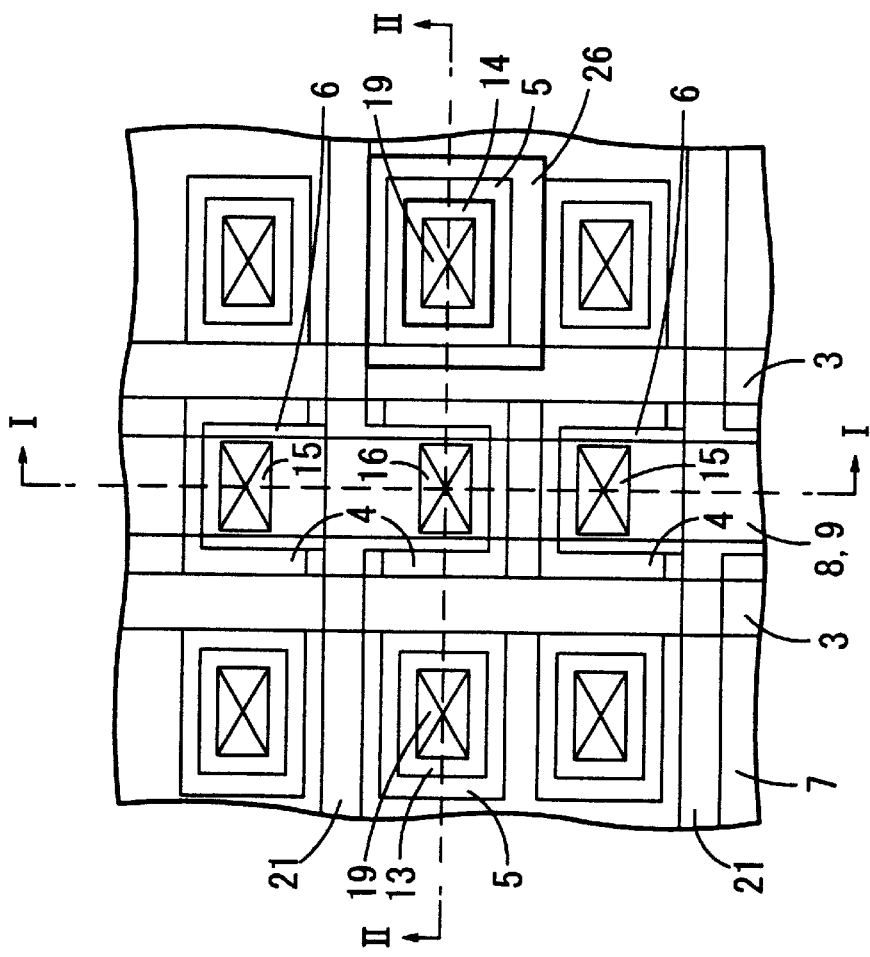
FIG. 7B is a perspective view of the planar layout of the semiconductor device of the fourth embodiment of this invention.
Figure 7A:
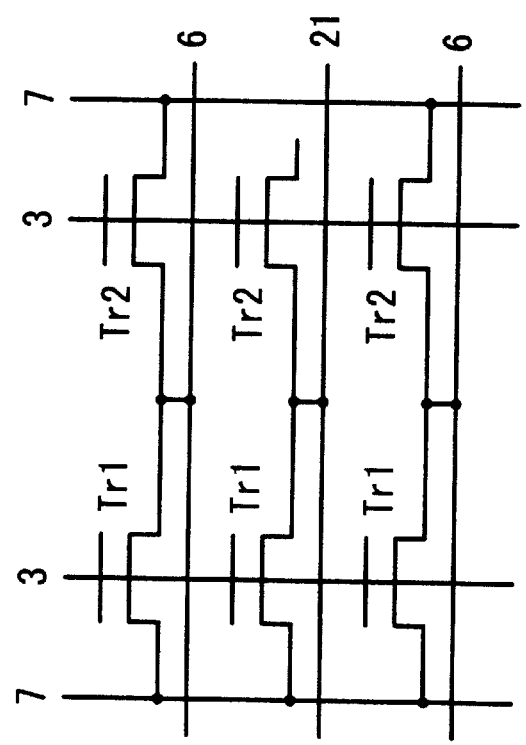
FIG. 7A is a circuit diagram of a semiconductor device of a fourth embodiment of this invention.
Figures 8A, 8B:
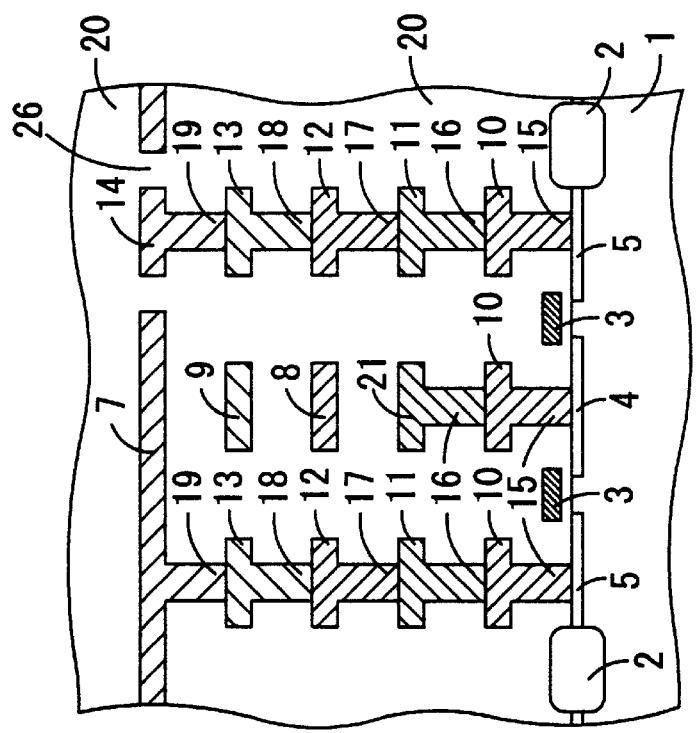
FIGS. 8A and 8B are sectional views of the semiconductor device of the fourth embodiment of this invention.

FIG. 7A is a circuit diagram of a semiconductor device of a fourth embodiment, FIG. 7B is a perspective view, which shows the planar layout of the same semiconductor device, FIG. 8A is a sectional view along line I—I of FIG. 7B, and FIG. 8B is a sectional view along line II—II of FIG. 7B. In FIGS. 7A, 7B, 8A, and 8B, the Si substrate 1, field oxide film 2, word line 3, drain diffusion layer 4, source diffusion layer 5, bit line 6, source line 7, word line backing wirings 8 and 9, first wiring layer 10, second wiring layer 11, third wiring layer 12, fourth wiring layer 13, fifth wiring layer 14, contact holes 15, 16, 17, 18, and 19, interlayer insulating film 20, and hole 26 are the same as those of the second embodiment. 21 is a bit line arranged from the second wiring layer.

With the present embodiment, adjacent bit lines 6 and 21 are arranged in the same manner as in the third embodiment, and the arrangements of the other parts are the same as those of the second embodiment. The information writing method and information reading operation are the same as those of the second embodiment.

Thus with the present embodiment, the same effects as those of the second embodiment can be obtained, and furthermore, the area of the memory cell can be reduced by making bit line 6 of the first wiring layer and bit line 21 of the second wiring layer adjacent bit lines and positioning these so that they overlap with each other in part.

Though with the second and fourth embodiments, the hole 26 of fifth wiring layer 14, for electrically cutting off source diffuser layer 5 and source layer 7, was provided in the surroundings of contact hole 19, hole 26 may be provided not just in the surroundings of contact hole 19 but also above contact hole 19 and the surroundings of the part above contact hole 19.

What is claimed is:

1. A semiconductor device comprising a drain diffusion layer, which is formed on a semiconductor substrate and is in common to first and second transistors that make up a memory cell pair, a source diffusion layer for said first transistor and a source diffusion layer for said second transistor, which are formed on said semiconductor substrate in a manner whereby they are spaced from the drain diffusion layer by predetermined intervals so as to sandwich the drain diffusion layer, a first word line, which is coupled to a gate electrode of said first transistor, a second word line, which is coupled to a gate electrode of said second transistor, a bit line, which is arranged from a first wiring layer above said semiconductor substrate and is connected to said drain diffusion layer, and a source line, which is arranged from a second wiring layer above said first wiring layer above said semiconductor substrate, wherein the writing of information is performed by connection or non-connection of the respective source diffusion layers of said first and second transistors with said source line.

2. A semiconductor device as set forth in claim 1, wherein contact parts, which are arranged from a wiring layer that is one layer below the second wiring layer that comprises the source line and are connected respectively to the respective source diffusion layers of the first and second transistors, are provided, the connection of said source diffusion layer and said source line is determined by the provision of a contact hole in an interlayer insulating film between said contact part and said source line, and the non-connection of said source diffusion layer and said source line is determined by the non-provision of said contact hole.

3. A semiconductor device as set forth in claim 1, wherein the respective source diffusion layers of the first and second transistors are connected, via contact holes in an interlayer insulating film, with the second wiring layer that comprises the source line, non-connection of said source diffusion layer and said source line is determined by provision of a space in said second wiring layer between said contact hole and said source line, and connection of said source diffusion layer and said source line is determined by non-provision of said space.

4. A semiconductor device as set forth in claim 1, wherein a first low-resistance wiring, which is formed, in parallel to the first word line, from a wiring layer between the first wiring layer and the second wiring layer, is electrically connected to said first word line, and is lower in resistance than said first word line, and a second low-resistance wiring, which is formed, in parallel to the second word line, from a wiring layer between said first wiring layer and said second wiring layer that differs from the wiring layer of said first low-resistance wiring, is electrically connected to said second word line, and is lower in resistance than said second word line, are provided and said first low-resistance wiring and said second low-resistance wiring are positioned so that they overlap at least in part above said first and second word lines.

5. A semiconductor device as set forth in claim 1, wherein a plurality of memory cell pairs are disposed in the length direction of the first and second word lines, the first wiring layer that forms the bit line is arranged as the two wiring layers of an upper wiring layer and a lower wiring layer, said plurality of memory cell pairs are arranged so that a pair is formed by every two adjacently disposed memory cell pairs, the bit line of one of the memory cell pairs that form a pair is formed from the lower wiring layer of said first wiring layer, and the bit line of the other memory cell pair is formed from the upper wiring layer of said first wiring layer.

6. A semiconductor device as set forth in claim 4, wherein a plurality of memory cell pairs are disposed in the length direction of the first and second word lines, the first wiring layer that forms the bit line is arranged as the two wiring layers of an upper wiring layer and a lower wiring layer, said plurality of memory cell pairs are arranged so that a pair is formed by every two adjacently disposed memory cell pairs, the bit line of one of the memory cell pairs that form a pair is formed from the lower wiring layer of said first wiring layer, and the bit line of the other memory cell pair is formed from the upper wiring layer of said first wiring layer.

7. A semiconductor device as set forth in claim 1, wherein the source line has a width corresponding to a plurality of bit lines.

8. A semiconductor device as set forth in claim 1, wherein the source line is disposed perpendicular to the bit line.

* * * * *